(12) United States Patent
Wu

(10) Patent No.: US 9,054,540 B2
(45) Date of Patent: Jun. 9, 2015

(54) ELECTRICAL CHARGING DEVICE AND ELECTRICAL DOCKING STATION

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Guo-Ping Wu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 271 days.

(21) Appl. No.: 13/725,122

(22) Filed: Dec. 21, 2012

(65) Prior Publication Data
US 2013/0162212 A1 Jun. 27, 2013

(30) Foreign Application Priority Data
Dec. 21, 2011 (CN) .......................... 2011 1 0432411

(51) Int. Cl.
*H02J 7/00* (2006.01)
*H05K 7/00* (2006.01)

(52) U.S. Cl.
CPC ................ *H02J 7/0042* (2013.01); *H05K 7/00* (2013.01); *H02J 7/0045* (2013.01)

(58) Field of Classification Search
USPC .................. 320/107, 113, 114, 115, 116, 162
See application file for complete search history.

(56) References Cited

U.S. PATENT DOCUMENTS

| | | | | |
|---|---|---|---|---|
| 6,329,787 B1* | 12/2001 | Ito et al. | ......................... | 320/114 |
| 7,257,429 B2* | 8/2007 | Kogan | .......................... | 455/573 |
| 8,115,451 B2* | 2/2012 | Griffin, Jr. | ..................... | 320/115 |
| 8,212,521 B2* | 7/2012 | Choi | .............................. | 320/114 |
| 8,294,417 B2* | 10/2012 | Kaye et al. | ..................... | 320/108 |
| 8,742,720 B2* | 6/2014 | Kirtley et al. | ................. | 320/113 |
| 8,847,549 B2* | 9/2014 | Graham | ........................ | 320/115 |
| 2005/0226779 A1* | 10/2005 | Oldham et al. | ................. | 422/99 |
| 2010/0117598 A1* | 5/2010 | Lin et al. | ....................... | 320/115 |
| 2011/0164375 A1* | 7/2011 | Hayashida et al. | ...... | 361/679.41 |

* cited by examiner

*Primary Examiner* — Brian Ngo
(74) *Attorney, Agent, or Firm* — Novak Druce Connolly Bove + Quigg LLP

(57) ABSTRACT

An electrical charging device includes a top cover, a bottom cover and a fixing assembly. The fixing assembly includes a first button device, a second button device, and a lifting device. The first button device moves back and forth along a first axis with a first button pole retracting into the electrical charging device and protruding out from the electrical charging device. The second button device moves back and forth along a second axis, with a second button pole retracting into the electrical charging device and protruding out from the electrical charging device. The lifting device rises up and drops down along a third axis, with a contacting table carrying conductive pins protruding out from the electrical charging device and retracting into the electrical charging device, thereby making electrical contact with the electrical charging device.

20 Claims, 11 Drawing Sheets

ELECTRICAL CHARGING DEVICE AND ELECTRICAL DOCKING STATION

BACKGROUND

1. Technical Field

The present disclosure relates to electrical charging devices and electrical docking stations.

2. Description of Related Art

Rechargeable batteries are used with numerous kinds of electrical devices and products. When a rechargeable battery runs out of power and requires charging, a user typically has to employ both hands to pull the battery out from the electrical device and load the battery into a charging device. This may be inconvenient for the user.

What is needed, therefore, is a means which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Reference will be made to the drawings to describe various embodiments.

Figure 1:
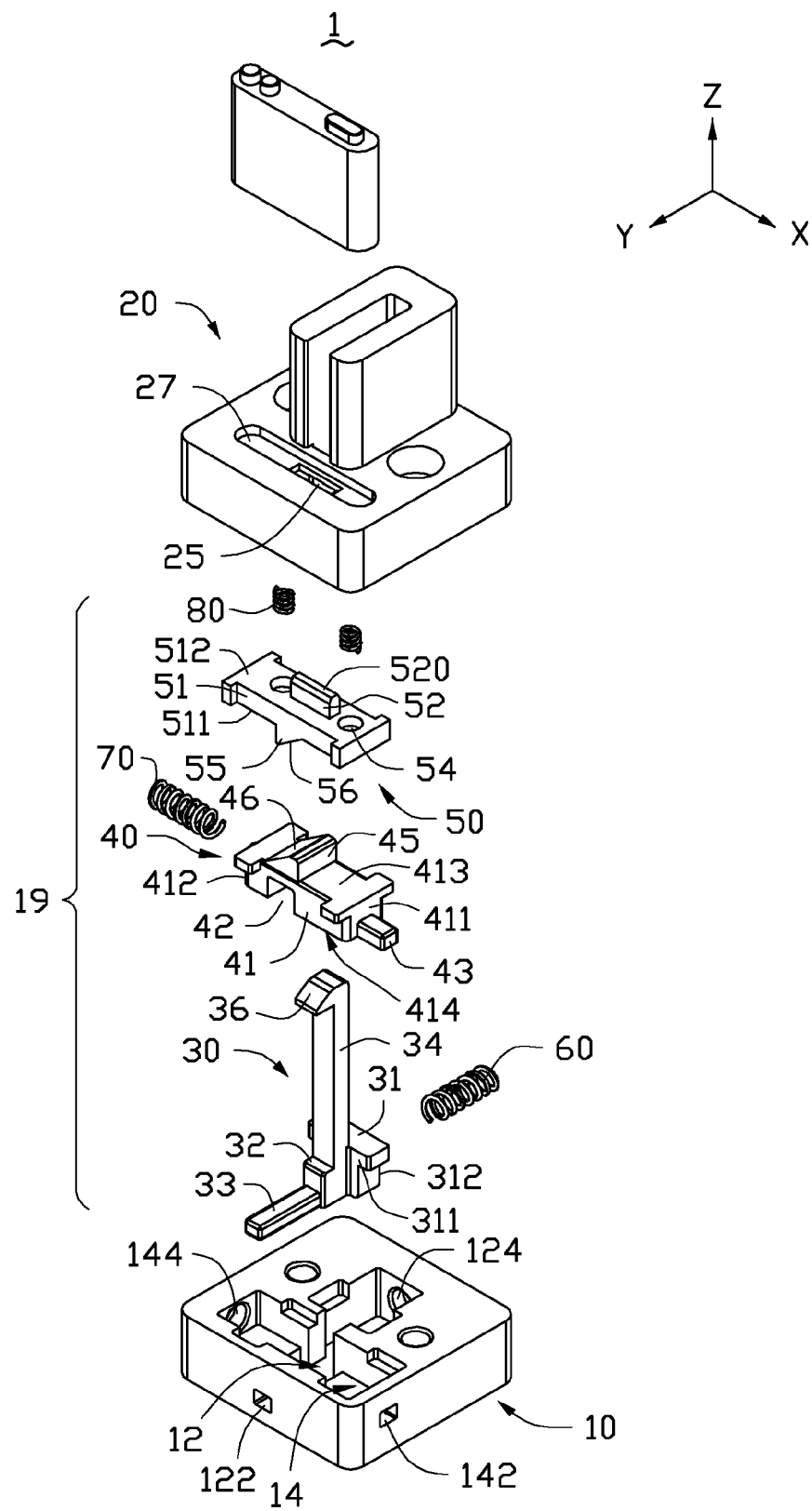
FIG. 1 is an exploded, isometric view of an exemplary embodiment of an electrical charging device, wherein the electrical charging device includes a bottom cover, a fixing assembly and a top cover, also showing a battery.
Figure 2:
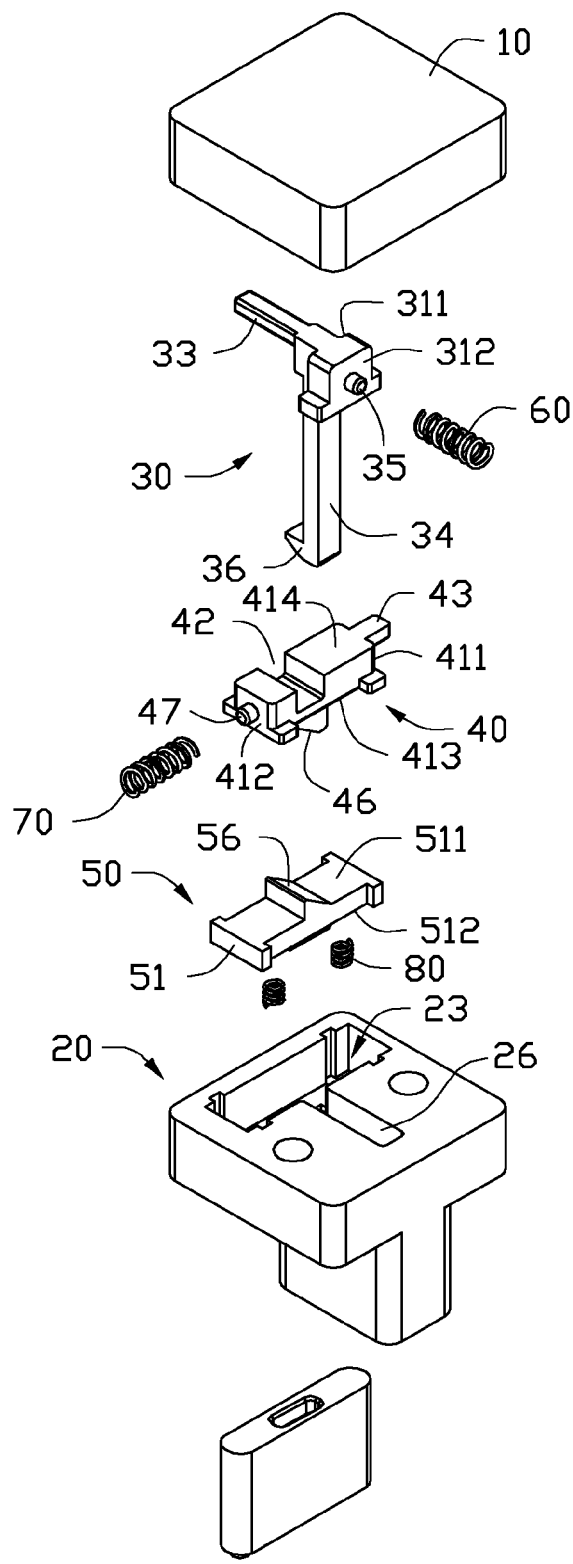
FIG. 2 shows the electrical charging device and battery of FIG. 1 viewed from a reverse direction.

Referring to FIGS. 1 and 2, in one embodiment, an electrical charging device 1 includes a top cover 20, a bottom cover 10, and a fixing assembly 19. The top cover 20 and the bottom cover 10 cooperate to receive the fixing assembly 19. The fixing assembly 19 fixes a battery in place on the electrical charging device 1 during a charging state, and releases the battery after the charging.

The bottom cover 10 defines a first accommodating space 12 extending along a first axis (Y axis), and a second accommodating space 14 extending along a second axis (X axis) perpendicular to the first axis. A first inner end surface of the first accommodating space 12 defines a first through hole 122 extending along the first axis. A second inner end surface opposite to the first inner end surface of the first accommodating space 12 defines a first containing groove 124. The first through hole 122 intercommunicates the first accommodating space 12 and the outside of the bottom cover 10. A first inner end surface of the second accommodating space 14 defines a second through hole 142 extending along the second axis. A second inner end surface opposite to the first inner end surface of the second accommodating space 14 defines a second containing groove 144. The second through hole 142 intercommunicates the second accommodating space 14 and the outside of the bottom cover 10.

Figure 3:
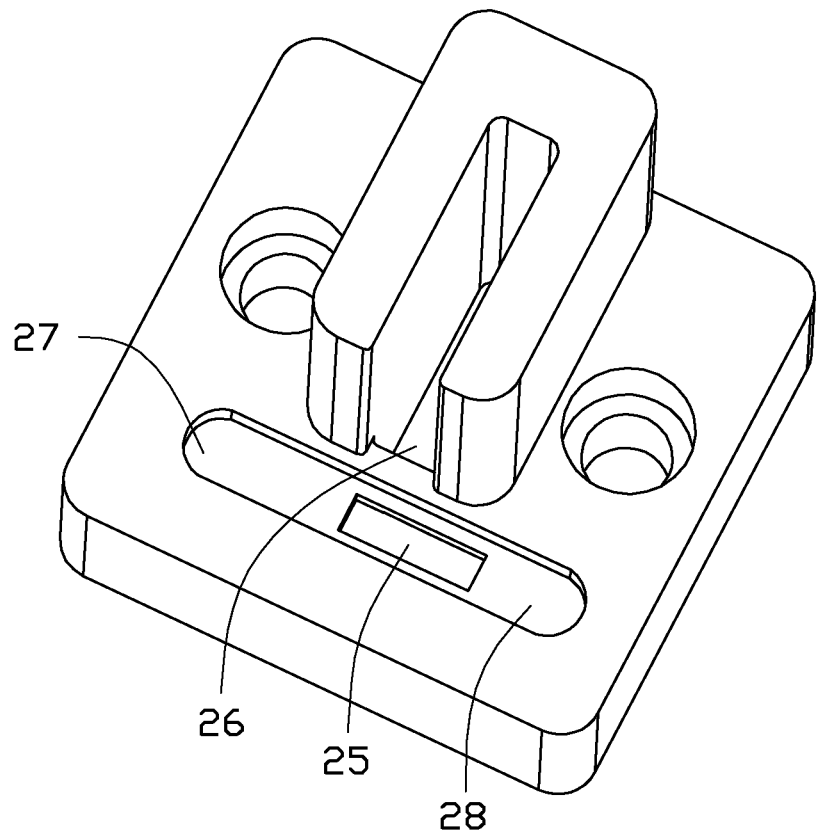
FIG. 3 is an isometric view of the top cover of FIG. 1.
Figure 4:
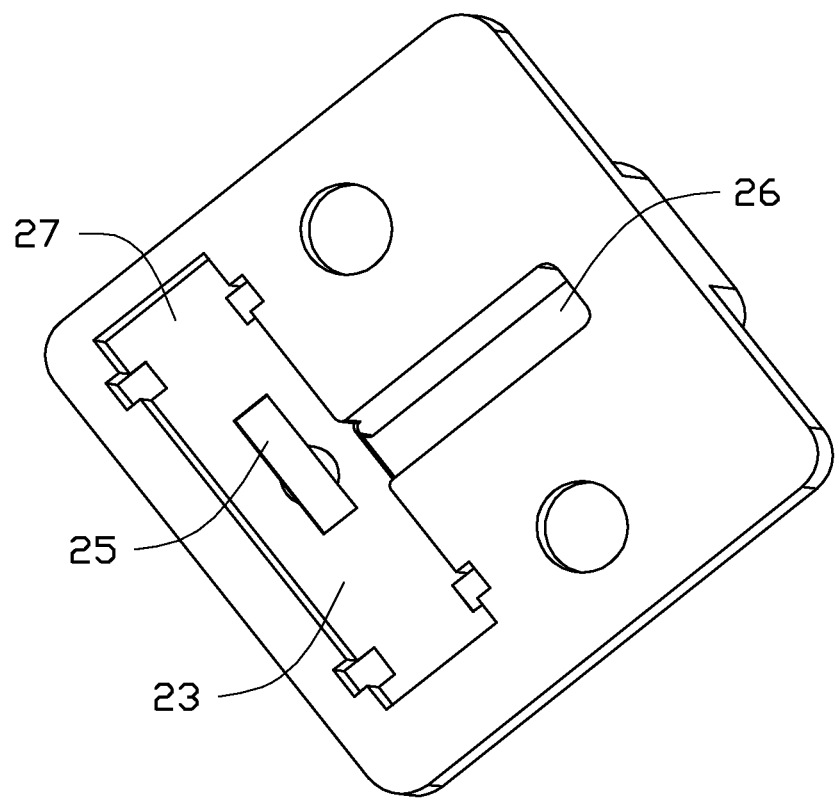
FIG. 4 shows the top cover of FIG. 3 viewed from another side.

Referring also to FIGS. 3 and 4, the top cover 20 includes a lower surface and an upper surface. A U-shaped tower portion (not labeled) extends up from the upper surface. The lower surface defines a third accommodating space 23 extending along the second axis, and the upper surface defines a receiving groove 28 extending along the second axis to receive a battery. The third accommodating space 23 and the receiving groove 28 are separated by a division plate 27. The division plate 27 defines a third through hole 25, and the third through hole 25 intercommunicates the third accommodating space 23 and the receiving groove 28. A receiver slot 26 extending along the first axis passes through the upper and lower surfaces of the top cover 20. The location of the receiver slot 26 corresponds to a space inside the U-shape of the tower portion.

The fixing assembly 19 includes a first button device 30, a second button device 40, a lifting device 50, a first elastic member 60, a second elastic member 70, and two third elastic members 80.

The first button device 30 includes a first main body 31, an extending pole 34 extending along a third axis (Z axis) perpendicular to the first and second axes, a limiting block 32, and a first button pole 33 extending along the first axis. The first main body 31 includes a first surface 311 and a second surface 312 at opposite sides thereof. The first and second surfaces 311, 312 are perpendicular to the first axis. A first end of the extending pole 34 is connected to the first surface 311 of the first main body 31, and a hook 36 is formed at a second end of the extending pole 34 furthest from the first end of the extending pole 34. The hook 36 and the first main body 31 are located at opposite front and rear sides of the extending pole 34, respectively. The limiting block 32 interconnects the first button pole 33 and the extending pole 34 at the first end of the extending pole 34. A width of the limiting block 32 along the second axis is greater than a width of the first button pole 33 along the second axis. A height of the limiting block 32 is greater than a height of the first button pole 33, and the top surface of the limiting block 32 is higher than the top surface of the first button pole 33, thereby forming a step between the limiting block 32 and the first button pole 33. A first fixing pole 35 is formed at the second surface 312 of the first main body 31. The first button device 30 moves back and forth along the first axis in the first accommodating space 12, and correspondingly the first button pole 33 retracts substantially into the first through hole 122 and protrudes out from the first through hole 122.

The second button device 40 includes a second main body 41, a second button pole 43 extending along the second axis, and a supporting table 45. The second main body 41 includes a third surface 411, a fourth surface 412, a fifth surface 413, and a sixth surface 414. The third and fourth surfaces 411, 412 are at opposite ends of the second main body 41, and are perpendicular to the second axis. The fifth and sixth surfaces 413, 414 are at opposite sides of the second main body 41, and are perpendicular to the third axis. The second button pole 43 is formed at the third surface 411 of the second main body 41. A second fixing pole 47 is formed at the fourth surface 412 of the second main body 41. The supporting table 45 is formed at the fifth surface 413 of the second main body 41. The supporting table 45 includes a first slant surface 46. The first slant surface 46 is located gradually closer and closer to the second button pole 43 along a direction of the first slant surface 46 away from the fifth surface 413 of the second main body 41. The sixth surface 414 defines a channel 42 passing through the second main body 41 along the first axis. The second button device 40 moves back and forth along the second axis in the second accommodating space 14, and correspondingly the second button pole 43 retracts substantially into the second through hole 142 and protrudes out from the second through hole 142.

The lifting device 50 includes a third main body 51, a lifting table 55, and a contacting table 52 with conductive charging pins 520 thereon. In the drawings, the conductive charging pins 520 are merely shown schematically as comprised in a group represented by a top block portion of the contacting table 52. The third main body 51 includes a seventh surface 511 and an eighth surface 512 at opposite sides thereof. The seventh and eighth surfaces 511, 512 are perpendicular to the third axis. The lifting table 55 is formed at the seventh surface 511 of the third main body 51. The lifting table 55 includes a second slant surface 56, which movably contacts the first slant surface 46 of the second main body 41. The second slant surface 56 is located gradually farther and farther from the second button pole 43 along a direction of the second slant surface 56 away from the seventh surface 511 of the third main body 51. The contacting table 52 is formed at the eighth surface 512 of the third main body 51. The eighth surface 512 defines two third containing grooves 54 located at opposite sides of the contacting table 52, respectively. The lifting device 50 moves up and down along the third axis in the third accommodating space 23, to drive the contacting table 52 to retract substantially into the third through hole 25 and protrude out from the third through hole 25.

Figure 5:
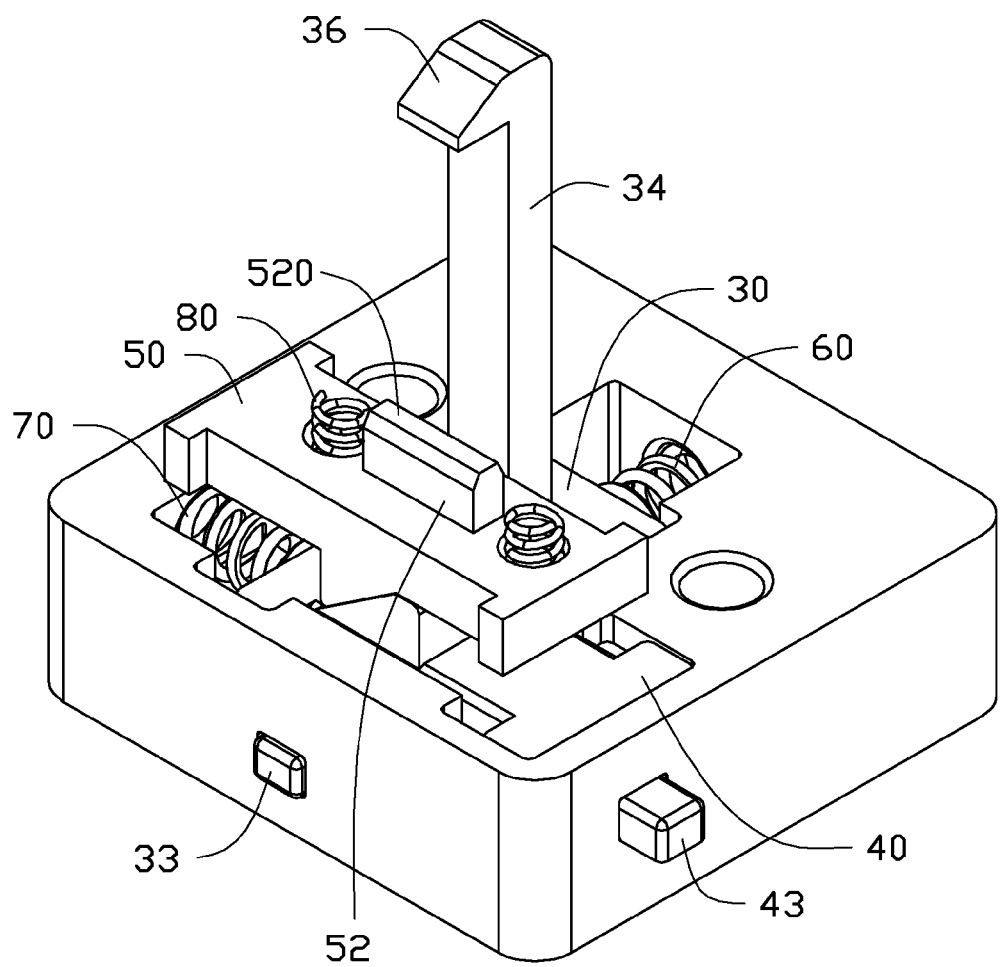
FIG. 5 is an assembled, isometric view of the bottom cover and the fixing assembly of FIG. 1.
Figure 6:
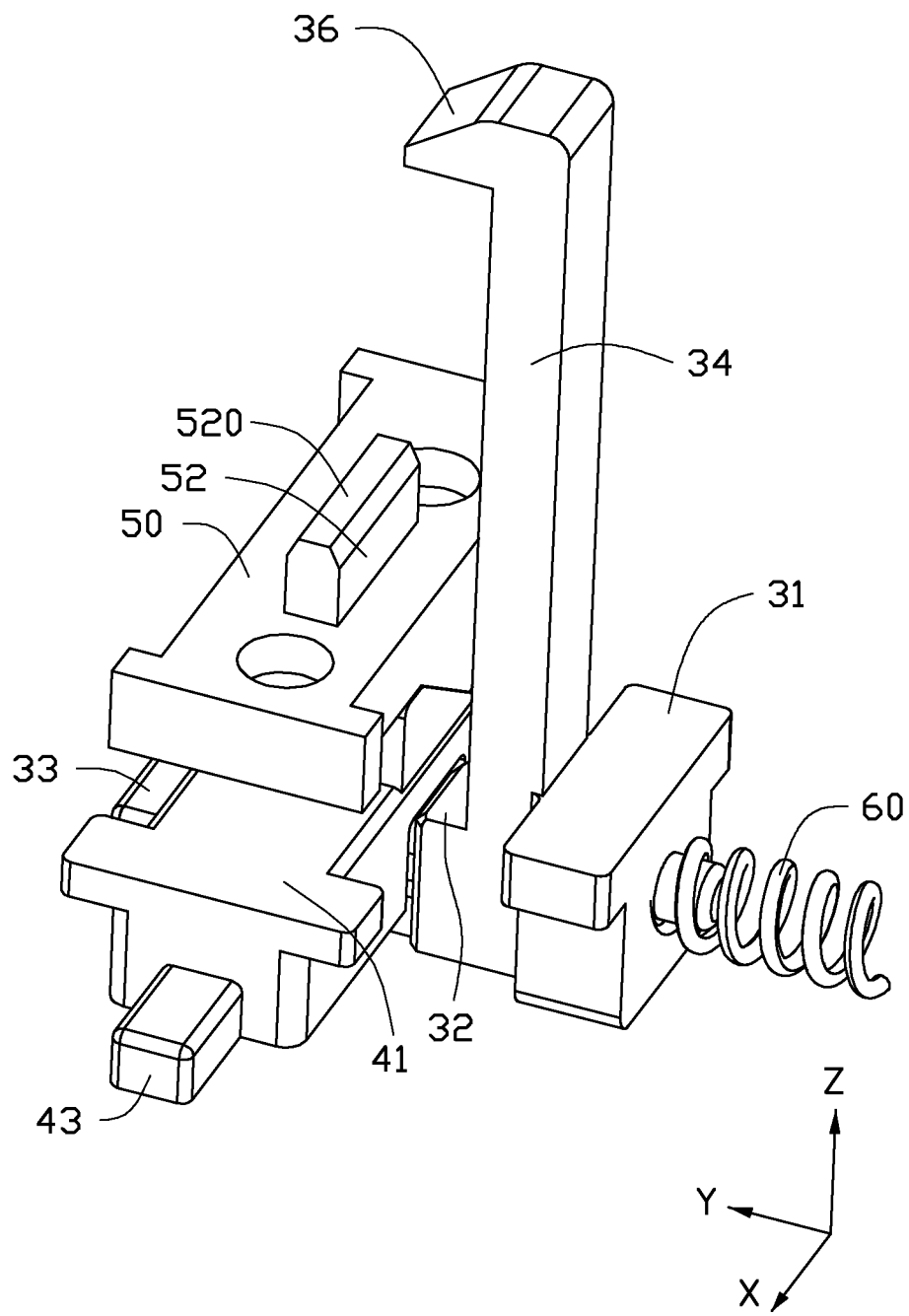
FIG. 6 is essentially an assembled, isometric view of the fixing assembly of FIG. 5.

Referring also to FIGS. 5-6, in assembly of the bottom cover 10 and the fixing assembly 19, the first elastic member 60 is sleeved on the first fixing pole 35 of the first button device 30, and the first button device 30 and the first elastic member 60 are received in the first accommodating space 12. The first elastic member 60 is captive between an inmost surface of the first containing groove 124 and the second surface 312 of the first main body 31, and the first button pole 33 is received in the first through hole 122. An external force is applied to the first button device 30 to drive the first button device 30 to move rearward towards the first containing groove 124 along the first axis, the first elastic member 60 is compressed, and the distal end of the first button pole 33 is thus retracted substantially into the first through hole 122. The first button device 30 is retained in this position in preparation for installation of the second button device 40, described below.

The second elastic member 70 is sleeved on the second fixing pole 47 of the second button device 40, and the second button device 40 and the second elastic member 70 are received in the second accommodating space 14. The second button device 40 is in front of the limiting block 32 of the first button device 30, with the limiting block 32 and the extending pole 34 located between the first main body 31 and the second main body 41, and at least part of the first button pole 33 movably received in the channel 42 of the second main body 41. The second elastic member 70 is captive between an inmost surface of the second containing groove 144 and the fourth surface 412 of the second main body 41.

Figure 10:
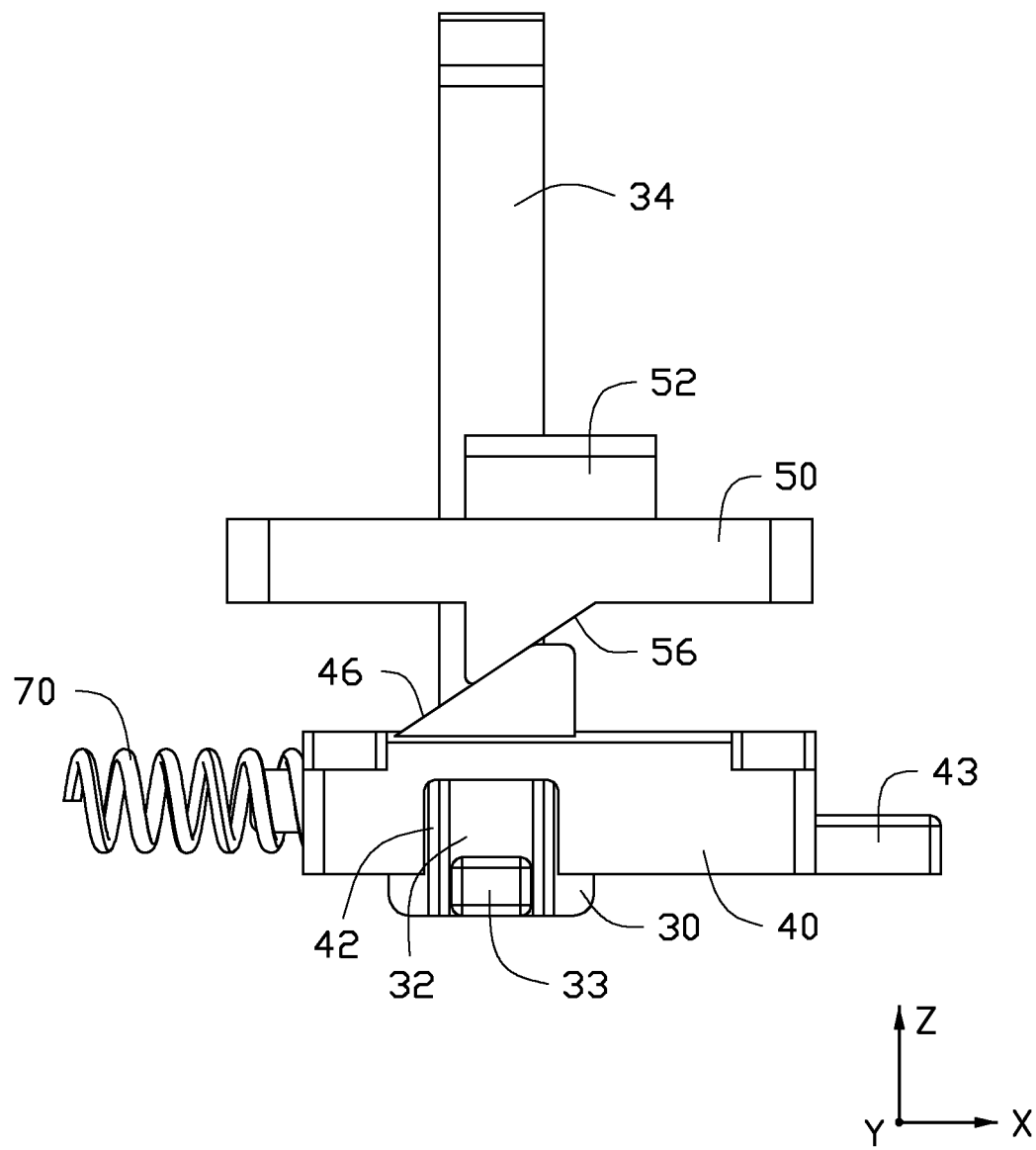
FIG. 10 is a plan view of the fixing assembly of FIG. 6.

FIGS. 6 and 10 show the second button device 40 in a position where the limiting block 32 of the first button device 30 is aligned with the channel 42 of the second button device 40. From this position, the second elastic member 70 drives the second button device 40 to move away from the second containing groove 144 until an inner surface of the channel 42 abuts the first button pole 33, at which point the second button device 40 is blocked from further movement and the distal end of the second button pole 43 protrudes out from the second through hole 142. Because the width of the limiting block 32 along the second axis is greater than the width of the first button pole 33 along the second axis, the limiting block 32 stays outside the channel 42 and abuts the second main body 41, preventing the first button device 30 from moving forward and protruding the first button pole 33 out from the first through hole 122. Then the lifting device 50 is located on the second button device 40. The seventh surface 511 of the third main body 51 faces the fifth surface 413 of the second main body 41, the second slant surface 56 movably abuts the first slant surface 46, and a top end of the second slant surface 56 is nearest to the fifth surface 413 of the second main body 41.

Figure 7:
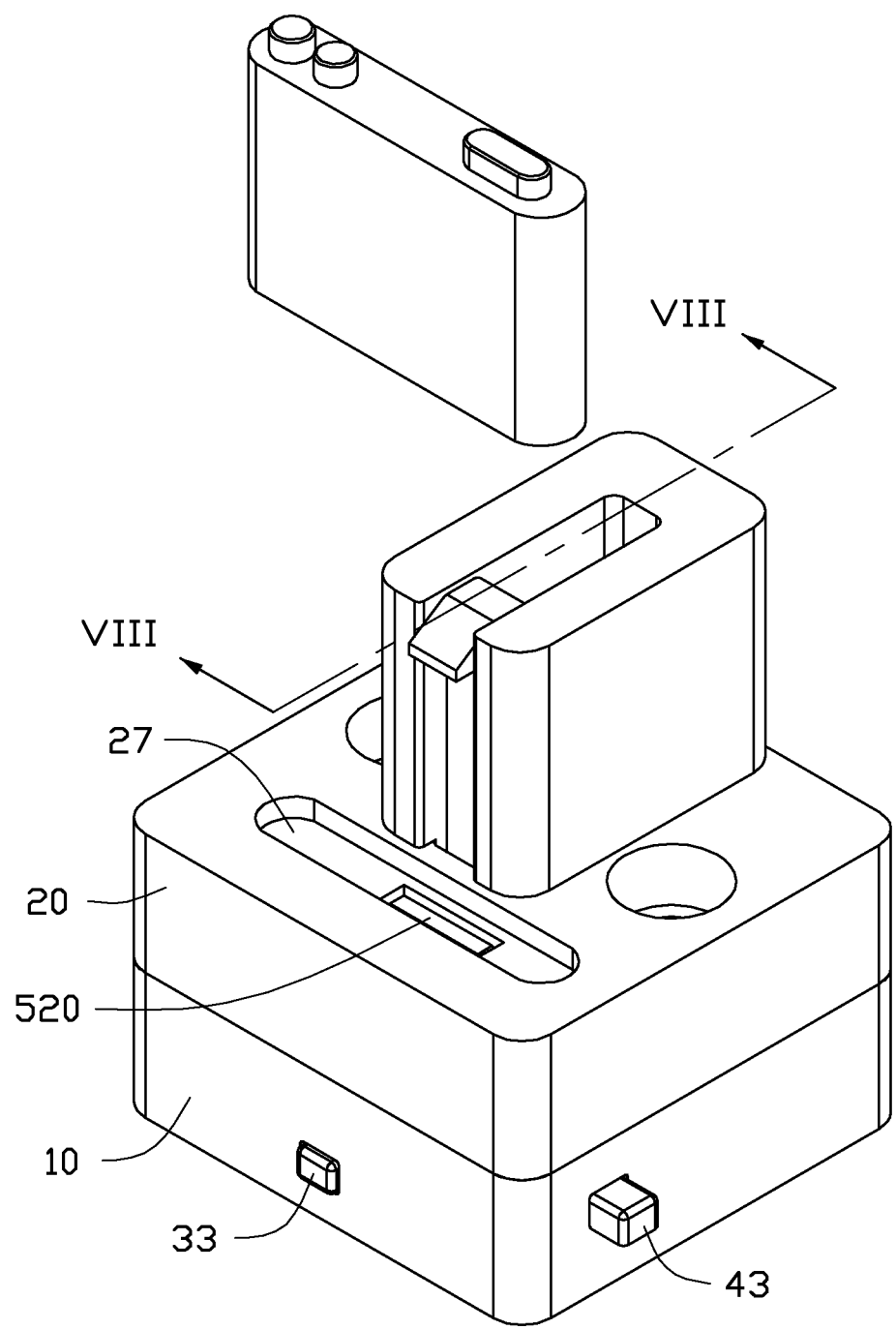
FIG. 7 is similar to FIG. 1, but showing the electrical charging device assembled.
Figure 8:
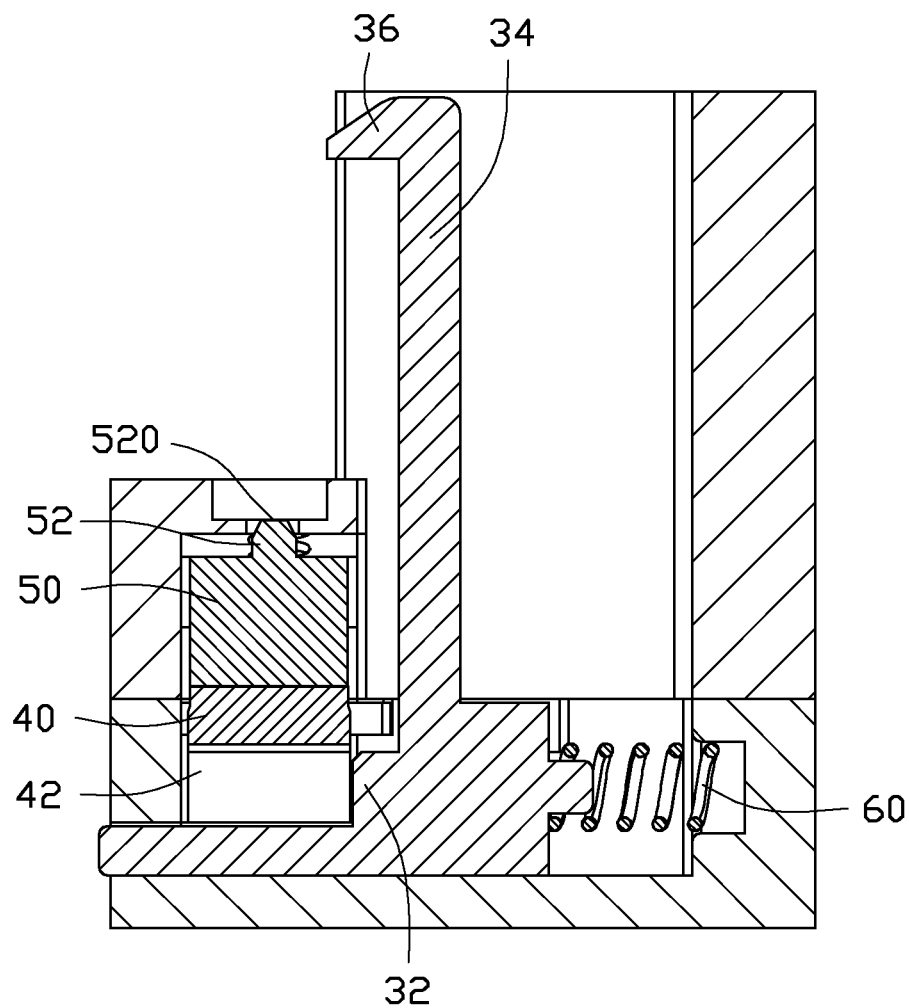
FIG. 8 is a cross-sectional view taken along line VIII-VIII of FIG. 7.

Referring also to FIGS. 7-8, in assembly of the top cover 20 to the subassembly of the bottom cover 10 and fixing assembly 19, the third elastic members 80 are received in the third containing grooves 54. The top cover 20 engages with the bottom cover 10, with the lifting device 50 received in the third accommodating space 23, the third elastic members 80 captive between the eighth surface 512 of the third main body 51 and the division plate 27, the contacting table 52 retracted substantially into the third through hole 25, and the extending pole 34 protruded out from the receiver slot 26 and located substantially in the space inside the U-shape of the tower portion. The extending pole 34 is capable of moving back and force in the receiver slot 26 and the space inside the U-shape of the tower portion. In particular, when the first button pole 34 of the first button device 30 is retracted substantially into the first through hole 122, the hook 36 moves rearward in unison with the first button device 30 and locates behind the receiving groove 28.

Figure 9:
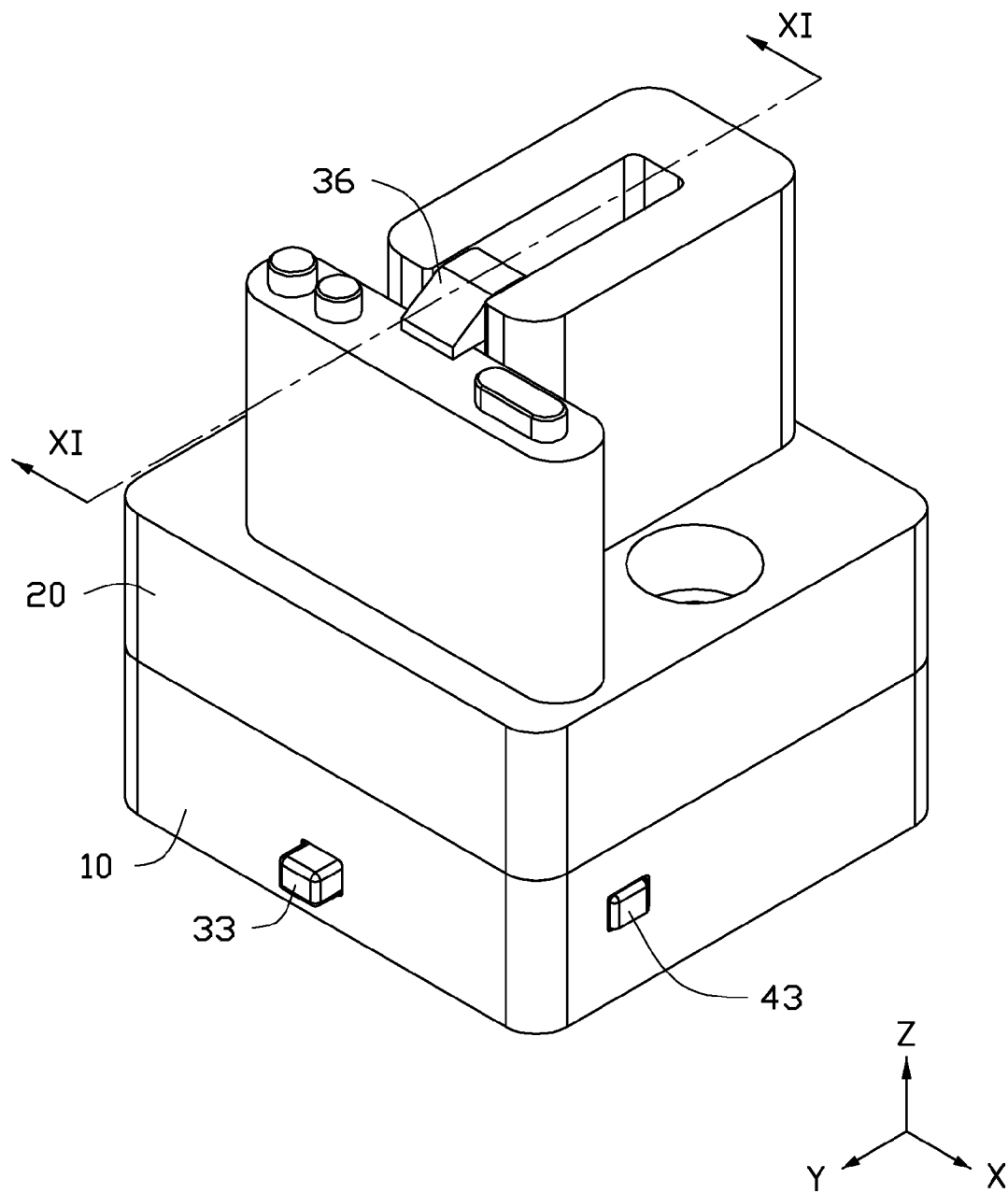
FIG. 9 is similar to FIG. 7, but showing the battery engaged on the electrical charging device.
Figure 11:
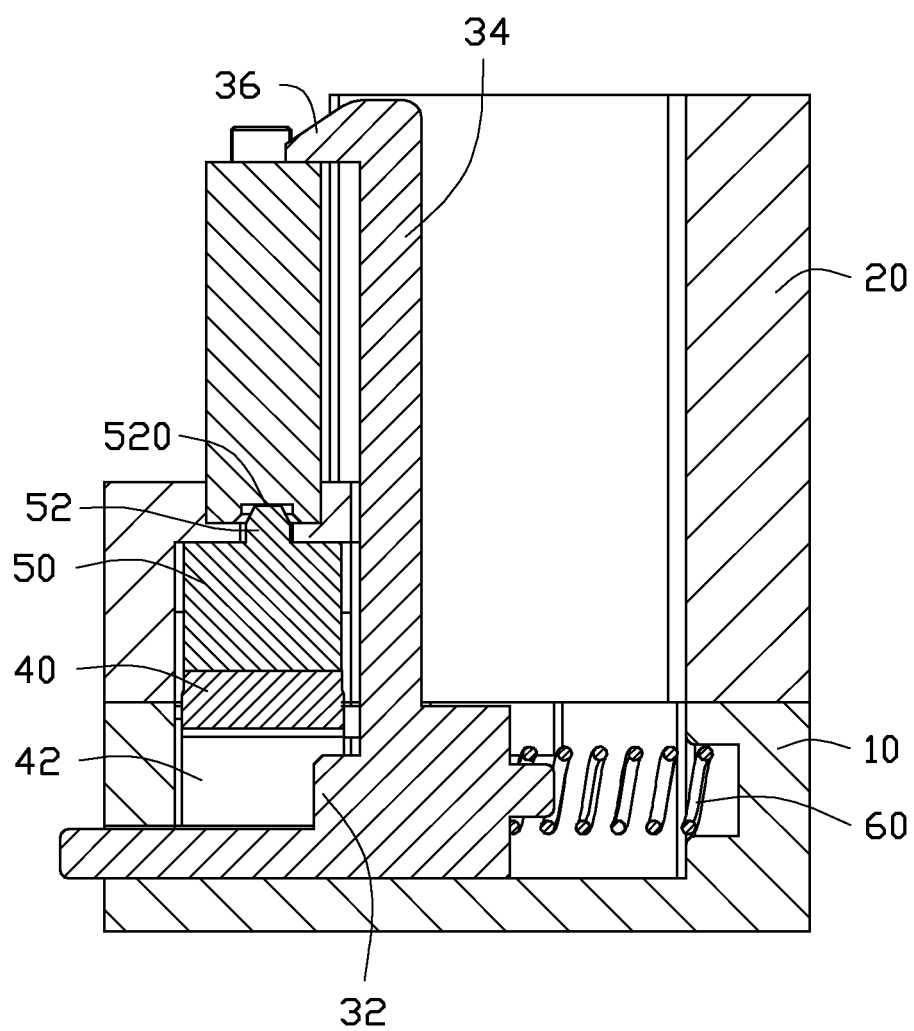
FIG. 11 is a cross-sectional view taken along line XI-XI of FIG. 9.

Referring also to FIGS. 9-11, when the electrical charging device 1 is utilized for charging a battery, the battery is put into the receiving groove 28. Then the distal end of the second button pole 143 is pressed by a user such that the distal end of the second button pole 143 retracts substantially into the second through hole 142. The second button device 40 moves towards the second containing groove 144 along the second axis, the channel 42 moves in unison with the second button device 40 and aligns with the limiting block 32, and the second elastic member 70 is compressed. The first elastic member 60 thus drives the first button device 30 to move forward away from the first containing groove 124 until the limiting block 32 fully enters the channel 42, at which point the first button device 40 is blocked from further movement and the distal end of the first button pole 33 of the first button device 30 is protruded out from the first through hole 122. The extending pole 34 and the hook 36 move forward in unison with the first button device 30, and thereby the hook 36 engages with the top of the battery, to fix the battery in place in the electrical charging device 1. Because the first slant surface 46 of the supporting table 45 abuts the second slant surface 56 of the lifting table 55, when the first slant surface 46 of the supporting table 45 moves towards the second containing groove 144 in unison with the second button device 50, the first slant surface 46 drives the lifting table 55 to rise up, the third elastic members 80 are compressed, and the contacting table 52 rises up in unison with the lifting table 55 of the lifting device 50. Thereby, the contacting table 52 is protruded out from the third through hole 25 and plugs into the interface of the battery, resulting in the conductive charging pins 520 loaded in the contacting table 52 engaging and making electrical contact with (e.g.) pins of the interface of the battery. In this way, the battery can be charged.

When the charging of the battery is finished, the distal end of the first button pole 33 is pressed by the user such that the distal end of the first button pole 143 retracts substantially into the first through hole 122. The limiting block 32 moves rearward towards the first containing groove 124 and locates outside the channel 42, the second button device 40 moves away from the second containing groove 144 under urging of the decompressing second elastic member 70 until the inner surface of the channel 42 abuts the first button pole 33, and the second button pole 43 protrudes out from the second through hole 142. The supporting table 45 moves in unison with the second button device 40, the decompressing third elastic members 80 drive the lifting device 50 downward, and the contacting table 52 retracts substantially into the third through hole 25 and disengages from the battery. Simultaneously, the hook 36 of the extending pole 34 moves rearward in unison with the first button device 30, and also disengages from the battery. The user is thus able to take the recharged battery away from the electrical charging device 1.

With the above-described configuration, the user can charge the battery using only one hand. In particular, the user puts the battery into the receiving groove 28, and presses the second button pole 43 to make the distal end of the second button pole 43 retract substantially into the second through hole 142. Later on, the user presses the first button pole 33 to make the distal end of the first button pole 33 retract substantially into the first through hole 122. This can be most convenient for the user.

The above-described structures can also be utilized in a variety of electrical docking stations. For example, an electrical docking station includes the above-described top cover 20, the above-described bottom cover 10, and the above-described fixing assembly 19. A desired electrical connecting element is provided at the receiving groove 28, for detachably connecting with an interface of a mating electrical device needing to be docked at the electrical docking station. The electrical docking station with the above-described structure can provide much convenience for users.

It is believed that the present embodiments and their advantages will be understood from the foregoing description, and it will be apparent that various changes may be made thereto without departing from the spirit and scope of the description or sacrificing all of their material advantages, the examples hereinbefore described merely being exemplary embodiments.

What is claimed is:

1. An electrical charging device, comprising:
a bottom cover defining a first accommodating space extending along a first axis and a second accommodating space extending along a second axis perpendicular to the first axis, a first through hole defined in a first inner end surface of the first accommodating space extending along the first axis and intercommunicating the first accommodating space and the outside of the bottom cover, a second through hole defined in a first inner end surface of the second accommodating space extending along the second axis and intercommunicating the second accommodating space and the outside of the bottom cover;
a fixing assembly comprising a first button device, a second button device, and a lifting device;
the first button device comprising a first button pole and configured to move back and forth along the first axis inside the first accommodating space with the first button pole retracting substantially into the first through hole and protruding out from the first through hole;
the second button device comprising a second button pole and configured to move back and forth along the second axis inside the second accommodating space with the second button pole retracting substantially into the second through hole and protruding out from the second through hole, the second button device further comprising a supporting table with a first slant surface; and
the lifting device arranged on the second button device and comprising a lifting table with a second slant surface and a contacting table with conductive pins provided thereon, the contacting table and the lifting table being at opposite sides of the lifting device, and the second slant surface movably abutting against the first slant surface; and
a top cover engaged with the bottom cover, with the top and bottom covers substantially receiving the fixing assembly therein, the top cover defining a third accommodating space, the lifting device configured to rise and descend along a third axis perpendicular to the first and second axes substantially inside the third accommodating space, a third through hole defined above the third accommodating space and extending along the third axis and intercommunicating the third accommodating space and the outside of the top cover, and the contacting table configured for retracting substantially into the third through hole and protruding out from the third through hole in unison with the movement of the lifting device.

2. The electrical charging device of claim 1, wherein when the second button device is in a position in which the second button pole protrudes out from the second through hole, the second button device blocks forward movement of the first button device; when the second button pole is pressed by external force to retract substantially into the second through hole, the second button device moves towards a second inner end surface of the second accommodating space opposite to the first inner end surface of the second accommodating space to a position in which the second button device no longer blocks forward movement of the first button device, simultaneously the first slant surface rides along the second slant surface thereby driving the lifting device up so that the contacting table carries the conductive pins to protrude out from the third through hole and be engagable with mating pins of a battery, and the first button device moves forward such that the first button pole protrudes out from the first through hole and the first button device blocks reverse movement of the second button device; and when the first button pole is pressed by external force to retract substantially into the first through hole, the first button device moves rearward towards a second inner end surface of the first accommodating space opposite to the first inner end surface of the first accommodating space to a position in which the first button device no longer blocks reverse movement of the second button device, the second button device moves reversely such that the first slant surface recedes from the second slant surface whereby the lifting device descends so that the contacting table carries the conductive pins to be disengagable from the mating pins of the battery and retract substantially into the third through hole, and the second button pole protrudes out from the second through hole.

3. The electrical charging device of claim 2, further comprising a first elastic member, a second elastic member and two third elastic members, wherein the first elastic member is captive between the first button device at a side of the first button device opposite from the side where the first button pole is located and the second inner end surface of the first accommodating space, the second elastic member is captive between the second button device at a side of the second button device opposite from the side where the second button pole is located and a second inner end surface of the second accommodating space, the third elastic members are located at opposite sides of the contacting table, and captive between the lifting device at a side where the contacting table is located and the inner end surface of the third accommodating space.

4. The electrical charging device of claim 3, wherein the first button device further comprises a first main body, an extending pole extending along the third axis, and a limiting block, the first main body comprises a first surface and a second surface at opposite sides thereof, the first and second surfaces are perpendicular to the first axis, a first end of the extending pole is connected to the first surface of the first main body, and a hook is formed at a second end of the extending pole, the limiting block interconnects the first button pole and the extending pole at the first end of the extending pole, the limiting block and the first main body locates at opposite sides of the extending pole, and the hook and the limiting block are located at a same side of the extending pole.

5. The electrical charging device of claim 4, wherein a width of the first button pole along the second axis is less than a width of the limiting block along the second axis, a height of the limiting block is greater than a height of the button pole, thereby forming a step between the limiting block and the first button pole, a first fixing pole is connected to the second surface of the first main body, the first elastic member sleeves on the first fixing pole.

6. The electrical charging device of claim 5, wherein the second button device comprises a second main body, the second main body includes a third surface, a fourth surface, a fifth surface, and a sixth surface, the third and fourth surfaces are at opposite sides of the second main body, and are perpendicular to the second axis, and the fifth and sixth surfaces are at opposite sides of the second main body, and are perpendicular to the third axis, the second button pole is formed at the third surface, a second fixing pole is formed at the fourth surface, the supporting table is formed at the fifth surface, the sixth surface defines a channel passing through the second main body along the first axis, and the first slant surface of the supporting table is located gradually closer and closer to the second button pole along a direction of the first slant surface away from the fifth surface of the second main body.

7. The electrical charging device of claim 6, wherein the lifting device comprises a third main body, the third main body includes a seventh surface and an eighth surface at opposite sides thereof, the seventh and the eighth surfaces are perpendicular to the third axis, the lifting table is formed at the seventh surface, the second slant surface is located gradually farther and farther from the second button pole along a direction of the second slant surface away from the seventh surface of the third main body, and the contacting table is formed at the eighth surface.

8. The electrical charging device of claim 7, wherein the top cover comprises a lower surface and an upper surface, the lower surface defines the third accommodating space, the upper surface defines a receiving groove to receive a battery, and the third accommodating space and the receiving groove are separated by a division plate, the division plate defines the third through hole, the third through hole interconnects the third accommodating space and the receiving groove, and a receiver slot extending along the first axis passes through the lower and upper surfaces of the top cover to allow the extending pole of the first button device to move back and forth along the first axis.

9. The electrical charging device of claim 8, wherein when the electrical charging device is utilized for charging the battery, the battery is put into the receiving groove, the distal end of the second button pole is pressed to retract substantially into the second through hole by external force, the second button device moves rearward towards the second inner end surface of the second accommodating space along the second axis, the channel moves rearward in unison with the second button device and aligns with the limiting block, the first elastic member drives the first button device to move forward towards the first through hole until the limiting block fully enters into the channel, at which point the first button device is blocked from further movement and the distal end of the first button pole protrudes out from the first through hole, the extending pole moves forward in unison with the first button device, the hook engages with the top of the battery to fix the battery in place in the electrical charging device, the first slant surface moves rearward in unison with the second button device and drives the lifting table to rise up, the third elastic members are compressed, and the contacting table rise up in unison with the lifting table of the lifting device, the contacting table protrudes out from the third through hole and plugs into an interface of the battery, resulting in the conductive pins loaded in the contacting table making contact with the pins of the battery.

10. The electrical charging device of claim 9, wherein when the distal end of the first button pole is pressed to retract substantially into the first through hole by external force, the limiting block moves rearward towards the second inner end surface of the first accommodating space in unison with the first button pole until the limiting block locates outside the channel, the second elastic member thus drives the second button device to move forward towards the second through hole until an inner surface of the channel abuts at least a part of the first button pole receiving in the channel, at which point the second button device is blocked from further movement and the distal end of the second button pole protrudes out from the second through hole, the first slant surface moves forward in unison with the second button device, and the third elastic members drive the lifting device to drop down, a top end of the second slant surface is nearest to the fifth surface of the second main body, and the contacting table is retracted substantially into the third through hole and disengages from the battery, the hook of the extending pole moves rearward in unison with the first button device and also disengages from the battery.

11. An electrical docking station, comprising:
   a bottom cover defining a first accommodating space extending along a first axis and a second accommodating space extending along a second axis perpendicular to the first axis, a first through hole defined in a first inner end surface of the first accommodating space extending along the first axis and intercommunicating the first accommodating space and the outside of the bottom cover, a second through hole defined in a first inner end surface of the second accommodating space extending along the second axis and intercommunicating the second accommodating space and the outside of the bottom cover;
   a fixing assembly comprising a first button device, a second button device, and a lifting device;
   the first button device comprising a first button pole and configured to move back and forth along the first axis inside the first accommodating space with the first button pole retracting substantially into the first through hole and protruding out from the first through hole;

the second button device comprising a second button pole and configured to move back and forth along the second axis inside the second accommodating space with the second button pole retracting substantially into the second through hole and protruding out from the second through hole, the second button device further comprising a supporting table with a first slant surface; and the lifting device arranged on the second button device and comprising a lifting table with a second slant surface and a contacting table, the lifting table and the contacting table being at opposite sides of the lifting device, the contacting table comprising an electrical interface configured for detachably connecting with an interface of a mating electrical device, the second slant surface movably abutting against the first slant surface; and a top cover engaged with the bottom cover, with the top and bottom covers substantially receiving the fixing assembly therein, the top cover defining a third accommodating space, the lifting device configured to rise and descend along a third axis perpendicular to the first and second axes substantially inside the third accommodating space, a third through hole defined above the third accommodating space and extending along the third axis and intercommunicating the third accommodating space and the outside of the top cover, and the contacting table configured for retracting substantially into the third through hole and protruding out from the third through hole in unison with the movement of the lifting device.

12. The electrical docking station of claim 11, wherein when the second button device is in a position in which the second button pole protrudes out from the second through hole, the second button device blocks forward movement of the first button device; when the second button pole is pressed by external force to retract substantially into the second through hole, the second button device moves towards a second inner end surface of the second accommodating space opposite to the first inner end surface of the second accommodating space to a position in which the second button device no longer blocks forward movement of the first button device, simultaneously the first slant surface rides along the second slant surface thereby driving the lifting device up so that the contacting table carries the electrical interface to protrude out from the third through hole and be engagable with the interface of a mating electrical device, and the first button device moves forward such that the first button pole protrudes out from the first through hole and the first button device blocks reverse movement of the second button device; and when the first button pole is pressed by external force to retract substantially into the first through hole, the first button device moves rearward towards a second inner end surface of the first accommodating space opposite to the first inner end surface of the first accommodating space to a position in which the first button device no longer blocks reverse movement of the second button device, the second button device moves reversely such that the first slant surface recedes from the second slant surface whereby the lifting device descends so that the contacting table carries the electrical interface to be disengagable from the interface of the mating electrical device and retract substantially into the third through hole, and the second button pole protrudes out from the second through hole.

13. The electrical docking station of claim 12, further comprising a first elastic member, a second elastic member and two third elastic members, wherein the first elastic member is captive between the first button device at a side of the first button device opposite from the side where the first button pole is located and the second inner end surface of the first accommodating space, the second elastic member is captive between the second button device at a side of the second button device opposite from the side where the second button pole is located and a second inner end surface of the second accommodating space, the third elastic members are located at opposite sides of the contacting table, and captive between the lifting device at a side where the contacting table is located and the inner end surface of the third accommodating space.

14. The electrical docking station of claim 13, wherein the first button device further comprises a first main body, an extending pole extending along the third axis, and a limiting block, the first main body comprises a first surface and a second surface at opposite sides thereof, the first and second surfaces are perpendicular to the first axis, a first end of the extending pole is connected to the first surface of the first main body, and a hook is formed at a second end of the extending pole, the limiting block interconnects the first button pole and the extending pole at the first end of the extending pole, the limiting block and the first main body locates at opposite sides of the extending pole, and the hook and the limiting block are located at a same side of the extending pole.

15. The electrical docking station of claim 14, wherein a width of the first button pole along the second axis is less than a width of the limiting block along the second axis, a height of the limiting block is greater than a height of the button pole, thereby forming a step between the limiting block and the first button pole, a first fixing pole is connected to the second surface of the first main body, the first elastic member sleeves on the first fixing pole.

16. The electrical docking station of claim 15, wherein the second button device comprises a second main body, the second main body includes a third surface, a fourth surface, a fifth surface, and a sixth surface, the third and fourth surfaces are at opposite sides of the second main body, and are perpendicular to the second axis, and the fifth and sixth surfaces are at opposite sides of the second main body, and are perpendicular to the third axis, the second button pole is formed at the third surface, a second fixing pole is formed at the fourth surface, the supporting table is formed at the fifth surface, the sixth surface defines a channel passing through the second main body along the first axis, and the first slant surface of the supporting table is located gradually closer and closer to the second button pole along a direction of the first slant surface away from the fifth surface of the second main body.

17. The electrical docking station of claim 16, wherein the lifting device comprises a third main body, the third main body includes a seventh surface and an eighth surface at opposite sides thereof, the seventh and the eighth surfaces are perpendicular to the third axis, the lifting table is formed at the seventh surface, the second slant surface is located gradually farther and farther from the second button pole along a direction of the second slant surface away from the seventh surface of the third main body, and the contacting table is formed at the eighth surface.

18. The electrical docking station of claim 17, wherein the top cover comprises a lower surface and an upper surface, the lower surface defines the third accommodating space, the upper surface defines a receiving groove to receive a battery, and the third accommodating space and the receiving groove are separated by a division plate, the division plate defines the third through hole, the third through hole interconnects the third accommodating space and the receiving groove, and a receiver slot extending along the first axis passes through the lower and upper surfaces of the top cover to allow the extending pole of the first button device to move back and forth along the first axis.

19. The electrical docking station of claim 18, wherein when the electrical docking station is utilized for connecting the electrical element, the electrical element is put into the receiving groove, the distal end of the second button pole is pressed to retract substantially into the second through hole by external force, the second button device moves rearward towards the second inner end surface of the second accommodating space along the second axis, the channel moves rearward in unison with the second button device and aligns with the limiting block, the first elastic member drives the first button device to move forward towards the first through hole until the limiting block fully enters into the channel, at which point the first button device is blocked from further movement and the distal end of the first button pole protrudes out from the first through hole, the extending pole moves forward in unison with the first button device, the hook engages with the top of the electrical element to fix the electrical element in place in the electrical docking station, the first slant surface moves rearward in unison with the second button device and drives the lifting table to rise up, the third elastic members are comprised, and the contacting table rise up in unison with the lifting table of the lifting device, the contacting table protrudes out from the third through hole and plugs into the interface of the matting electrical device, resulting in the electrical interface loaded in the contacting table making contact with the interface of the matting electrical device.

20. The electrical docking station of claim 19, wherein when the distal end of the first button pole is pressed to retract substantially into the first through hole by external force, the limiting block moves rearward towards the second inner end surface of the first accommodating space in unison with the first button pole until the limiting block locates outside the channel, the second elastic member thus drives the second button device to move forward towards the second through hole until an inner surface of the channel abuts at least a part of the first button pole receiving in the channel, at which point the second button device is blocked from further movement and the distal end of the second button pole protrudes out from the second through hole, the first slant surface moves forward in unison with the second button device, and the third elastic members drive the lifting device to drop down, a top end of the second slant surface is nearest to the fifth surface of the second main body, and the contacting table is retracted substantially into the third through hole and disengages from the electrical element, the hook of the extending pole moves rearward in unison with the first button device and also disengages from the electrical element.

* * * * *